(12) United States Patent
Park

(10) Patent No.: US 8,462,555 B2
(45) Date of Patent: Jun. 11, 2013

(54) NONVOLATILE MEMORY DEVICE AND READING METHOD TO READ FIRST MEMORY CELL IN ACCORDANCE OF DATA STORED IN SECOND MEMORY CELL ADJACENT TO FIRST MEMORY CELL

(75) Inventor: Jin Su Park, Daegu (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 338 days.

(21) Appl. No.: 12/826,261

(22) Filed: Jun. 29, 2010

(65) Prior Publication Data
US 2010/0329036 A1    Dec. 30, 2010

(30) Foreign Application Priority Data

Jun. 30, 2009   (KR) .................. 10-2009-0059155

(51) Int. Cl.
*G11C 11/34* (2006.01)
(52) U.S. Cl.
USPC .................................... 365/185.25

(58) Field of Classification Search
USPC .............. 365/185.25, 230, 189.05, 203
See application file for complete search history.

(56) References Cited

U.S. PATENT DOCUMENTS

| 7,324,378 B2 * | 1/2008 | Lee ................ 365/185.17 |
| 2008/0225597 A1 * | 9/2008 | Park ................ 365/185.22 |

FOREIGN PATENT DOCUMENTS

KR    1020090026502    3/2009

OTHER PUBLICATIONS

Korean Notice of Allowance for 10-2009-0059155, citing the above reference(s).

* cited by examiner

*Primary Examiner* — Van Nguyen
*Assistant Examiner* — Khamdan Alrobaie
(74) *Attorney, Agent, or Firm* — Lowe Hauptman Ham & Berner LLP

(57) ABSTRACT

In a nonvolatile memory device and operating method thereof, data programmed into a second memory cell is sensed and a first memory cell adjacent the second memory cell is read in accordance with the data sensed from the second memory cell.

19 Claims, 4 Drawing Sheets

NONVOLATILE MEMORY DEVICE AND READING METHOD TO READ FIRST MEMORY CELL IN ACCORDANCE OF DATA STORED IN SECOND MEMORY CELL ADJACENT TO FIRST MEMORY CELL

CROSS-REFERENCE TO RELATED APPLICATIONS

The present application claims priority under 35 U.S.C 119(a) to Korean Application No. 10-2009-0059155, filed on Jun. 30, 2009, in the Korean Intellectual Property Office, which is incorporated by reference in its entirety as set forth in full.

BACKGROUND

1. Technical Field

The disclosure relates generally to nonvolatile memory devices and reading methods thereof. In particular, the disclosure relates to a nonvolatile memory device and a reading method thereof that are capable of reading a selected cell while compensating for interference from adjacent cells.

2. Related Art

Nonvolatile memory devices generally have memory cell arrays in which data are stored, and page buffers for use in reading data.

A memory cell array is usually composed of a plurality of strings. Strings are electrically connected to page buffers through bit lines. Each string is formed by a plurality of memory cells which are coupled in series.

Memory cells adjacent to each other may be affected by electromagnetic interference, especially in a programming operation.

For instance, when programming a second cell of a second string, a threshold voltage distribution of a first cell of a first string adjacent to the second string could be changed due to electromagnetic interference.

FIG. 1 graphically shows variations of the threshold voltage distribution of a cell (e.g., an EVEN cell) upon programming an adjacent cell (e.g., an ODD cell).

As shown in FIG. 1, classifiable distributions of threshold voltages of memory cells are divisionally grouped in an erased state PV0, a first programmed state PV1, a second programmed state PV2 and a third programmed state PV3. If there is electromagnetic interference between adjacent memory cells, the threshold voltage distributions respective to the programmed or erased states change and may cause data to be incorrectly read in the subsequent reading operation.

In addition, the current tendency is to scale down memory devices and memory cells in size to achieve a higher integration density. As a result, circuits elements of such memory devise and memory cells become closer to each other. In a nonvolatile memory device, since plural strings including memory cells are arranged with a very narrow interval in between, a memory cell can be easily affected by capacitive coupling with adjacent memory cells. For example, if a second cell of a second string adjacent to a first cell of a first string is programmed after programming the first cell of the first string, threshold voltages of the first cell of the first string may be changed due to electromagnetic interference (i.e., via capacitive coupling) due to the programming operation of the second cell of the second string.

When programming (arrow L in FIG. 1) a least significant bit (LSB) into the second cell, there is no considerable effect by such interference because the second cell will be further programmed with a most significant bit (MSB) in the subsequent step and then the programming operation is completed.

However, when programming an MSB into the second cell (e.g., the ODD cell in FIG. 1), a degree of interference to the adjacent first cell (e.g., the EVEN cell in FIG. 1) is variable in accordance with a level of a program voltage of the second cell. For instance, a change in threshold voltage is larger when programming the second cell into the first or third programmed state PV1 or PV3 (arrow M1 or M3 in FIG. 1) than when programming the second cell into the second programmed state PV2 (arrow M2 in FIG. 1). Accordingly, the first cell of the first string adjacent to the second cell of the second string is more affected when programming the second cell of the second string into the first or third programmed state PV1 or PV3 (M1 or M3) than when programming the second cell of the second string into the second programmed state PV2 (M2).

This may resultantly cause the programming reliability to be degraded in the nonvolatile memory device when the first cell, which has been inadvertently changed in threshold voltage distribution due to such interference, is sensed in a reading operation.

SUMMARY

According to one or more embodiments, a nonvolatile memory device includes a memory block and reading circuitry. The memory block includes a plurality of first and second bit lines arranged in an alternating manner, a plurality of first memory cells coupled to each of the first bit lines to define a first memory string, and a plurality of second memory cells coupled to each of the second bit lines to define a second memory string. The circuitry is configured for reading a selected first memory cell after programming a second memory cell adjacent to the first memory cell. The circuitry is configured to sense data programmed into the second memory cell, and read the first memory cell in accordance with the sensed data.

According to one or more embodiments, a nonvolatile memory device comprises a memory cell array including adjacent first and second bit lines. A first page buffer is coupled with the first bit line. A first precharge controller is coupled to the first page buffer and configured to generate a first precharge signal to the first page buffer to precharge the first bit line. A second page buffer is coupled with the second bit line. A second precharge controller is coupled to the second page buffer and configured to generate a second precharge signal to the second page buffer to discharge the second bit line while reading a selected first memory cell coupled to the first bit line.

According to one or more embodiments, a method is provided for reading a nonvolatile memory device that comprises a memory block including adjacent first and second bit lines and adjacent first and second memory cells coupled to the first and second bit lines, respectively. The second memory cell is read and the second bit line is precharged in accordance with data read from the second memory cell. The first memory cell is read while discharging the second bit line.

DETAILED DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention.

The terminology used herein is for the purpose of describing particular embodiments only and is not intended to limit the scope of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the attached drawings.

Figure 2:
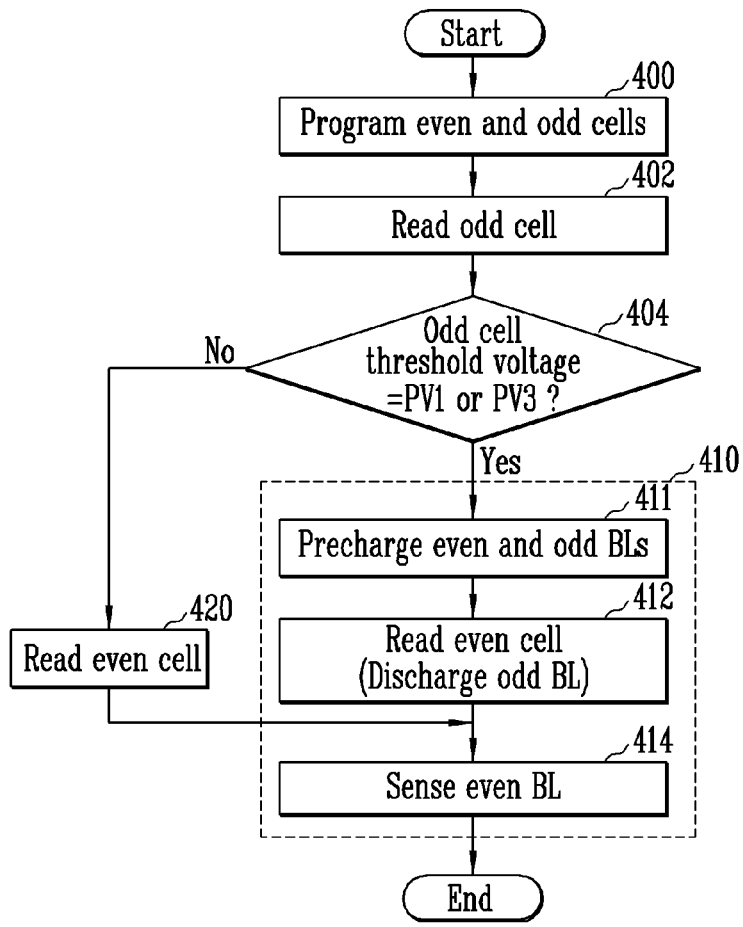
FIG. 2 is a flow chart showing a reading operation according to an embodiment of the present invention.

FIG. 2 shows a flow chart of a reading operation according to an embodiment of the present invention.

Referring to FIG. 2, a first cell (a memory cell coupled to a first bit line) and a second cell (a memory cell coupled to a second bit line) are programmed (step 400). The first and second cells are adjacent to each other, sharing a word line. In this description, the first bit line is referred to as an even bit line and the second bit line is referred to as an odd bit line. Other arrangements are within the scope of this disclosure.

It is assumed that the second cell has been programmed after programming the first cell. After programming the first and second cells, the second cell is read (step 402). Since the second cell has been programmed after programming the first cell, a threshold voltage of the first cell that has been programmed ahead of the second cell could be raised due to electromagnetic interference while programming the second cell. For that reason, before reading the first cell, the second cell is first read to determine how it (i.e., a memory cell adjacent to the first cell) has been programmed.

From reading the second cell, if the threshold voltage of the second cell is out of the first or third programmed state PV1 or PV3 (e.g., if the threshold voltage of the second cell is in the erased state PV0 or the second programmed state PV2), the first cell (i.e., the even cell) is read (step 420), without changing voltage levels of unselected bit lines, and then a voltage level of the first bit line is sensed (step 414). Thereby, a reading operation of the first cell is completed.

On the other hand, if the second cell is read as being in the first or third programmed state PV1 or PV3, the first cell is read (step 410) in the following manner.

Figure 1:
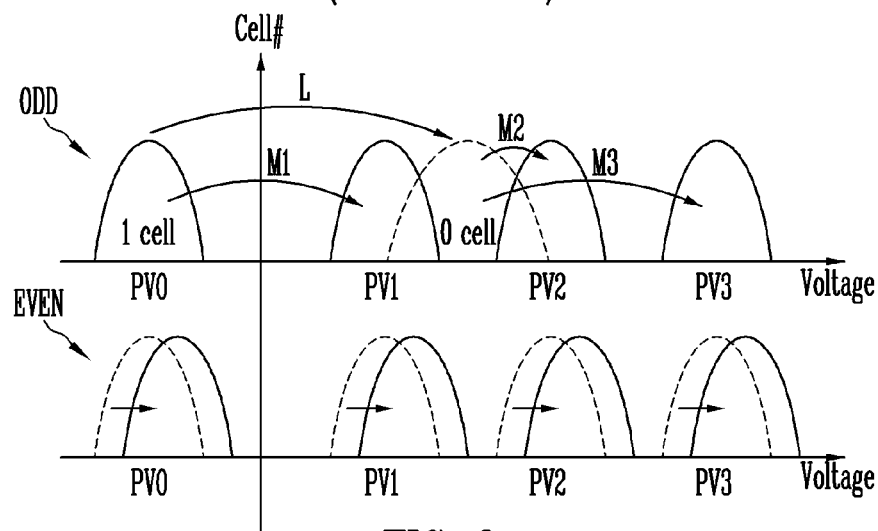
FIG. 1 is a graphic diagram showing variations of threshold voltage distributions.

In the reading stage 410 for the first cell (the even cell), the first and second bit lines are first precharged at (step 411). Subsequently, the first cell is read (step 412). During an evaluation period of the reading stage 410, the second bit lines (i.e., the odd bit lines) are all discharged at the same time to compensate for threshold voltage levels of the first bit lines (i.e., the even bit lines) that might have been changed by interference. As aforementioned, threshold voltages of the first cells may be raised by electromagnetic interference, such as capacitive couplings, while programming the second cells. For instance, the increase of threshold voltages in the first cells becomes larger when programming the adjacent second cells into the first or third programmed state PV1 or PV3 (arrow M1 or M3 of FIG. 1) than when programming the adjacent second cells into the second programmed state PV2 (arrow M2 of FIG. 1). That is, a greater amount of interference is applied to the first cell when programming the adjacent second cell into the first or third programmed state PV1 or PV3. Therefore, if the second cell (odd memory cell) has been programmed into the first or third programmed state PV1 or PV3, a threshold voltage level of the first bit line (even bit line) is reverted to its original one by a compensation voltage. That is, the threshold voltage level of the first bit line can be compensated for by a coupling effect while discharging the second bit line at the step 412. Then, a voltage level of the first bit line is sensed (step 414) and the reading operation of the first cell is completed.

Figure 3:
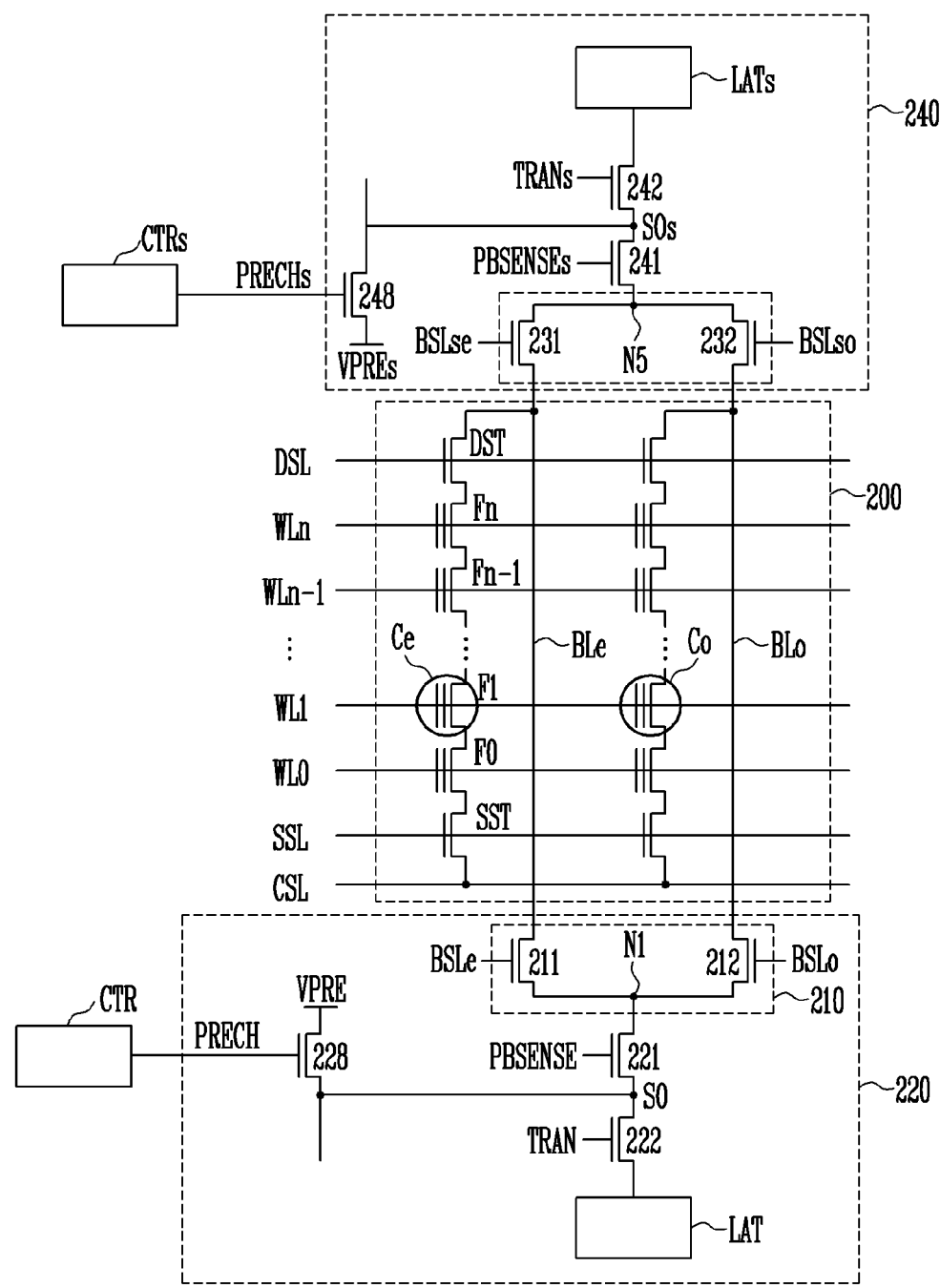
FIG. 3 is a circuit diagram illustrating a nonvolatile memory device according to an embodiment of the present invention.

FIG. 3 illustrates a circuit configuration of a nonvolatile memory device according to an embodiment of the present invention.

Referring to FIG. 3, the nonvolatile memory device according to an embodiment of the present invention includes a memory cell array 200 that stores data, and first and second page buffers 220 and 240 that transfer voltages to the memory cell array 200 through bit lines. The nonvolatile memory device also includes a first precharge controller CTR to supply a first precharge signal PRECH to the first page buffer 220, and a second precharge controller CTRs to supply a second precharge signal PRECHs to the second page buffer 240. The first and second page buffers 220 and 240 are coupled to the memory cell array 200 by way of the first and second bit lines BLe and BLo.

The memory cell array 200 is composed of a plurality of first and second strings (i.e., even and odd strings). The first and second strings are electrically connected to the first and second page buffers 220 and 240 through the first and second bit lines BLe and BLo, respectively. In FIG. 3, among the pluralities of even and odd strings, only one pair of adjacent even and odd strings coupled to the first and second bit lines BLe and BLo, respectively, is illustrated for convenience of description. Each string includes a plurality of memory cells F0~Fn (n is a natural number or positive integer). A source node of the string is coupled with a source selection transistor SST and a drain node of the string is coupled with a drain selection transistor DST. The source selection transistor SST is coupled between the first cell F0 and a common source line CSL.

Gate nodes of the memory cells (e.g., a plurality of F0) belonging to their respective strings are coupled with one word line (e.g., WL0) in common. Thus, the gate nodes of the memory cells F0~Fn of the strings are respectively coupled to word lines WL0~WLn on rows. Gate nodes of the source selection transistors SST belonging to their respective strings are coupled to a source selection line SSL in common. Gates nodes of the drain selection transistor DST belonging to their respective strings are coupled to a drain selection line DSL in common.

Each of the first and second page buffers 220 and 240 are partly shown in FIG. 3, and are formed in the same structure. Thus, hereinafter, only the first page buffer 220 will be described in detail.

The page buffer 220 is comprised of a first bit-line selector 210 to select the first bit line BLe or the second bit line BLo, an evaluation element 221, a transmission element 222, a first latch LAT and a precharge element 228. The first bit-line selector 210 includes a first bit-line selection element 211 to select the first bit line BLe, and a second bit-line selection element 212 to select the second bit line BLo. The first bit-line selection element 211 is coupled between the first bit line BLe and a first node N1, and operates in response to a first bit-line selection signal BSLe. The second bit-line selection element 212 is coupled between the second bit line BLo and the first node N1, and operates in response to a second bit-line selection signal BSLo. The evaluation element 221 is coupled between the first node N1 and a first sensing node S0, and operates in response to an evaluation signal PBSENSE. The transmission element 222 is coupled between the first sensing node S0 and the first latch LAT, and operates in response to a transmission signal TRAN. The precharge element 228 is coupled between a terminal of a first drive voltage VPRE and the first sensing node S0, and responds to a precharge signal PRECH.

Figure 4:
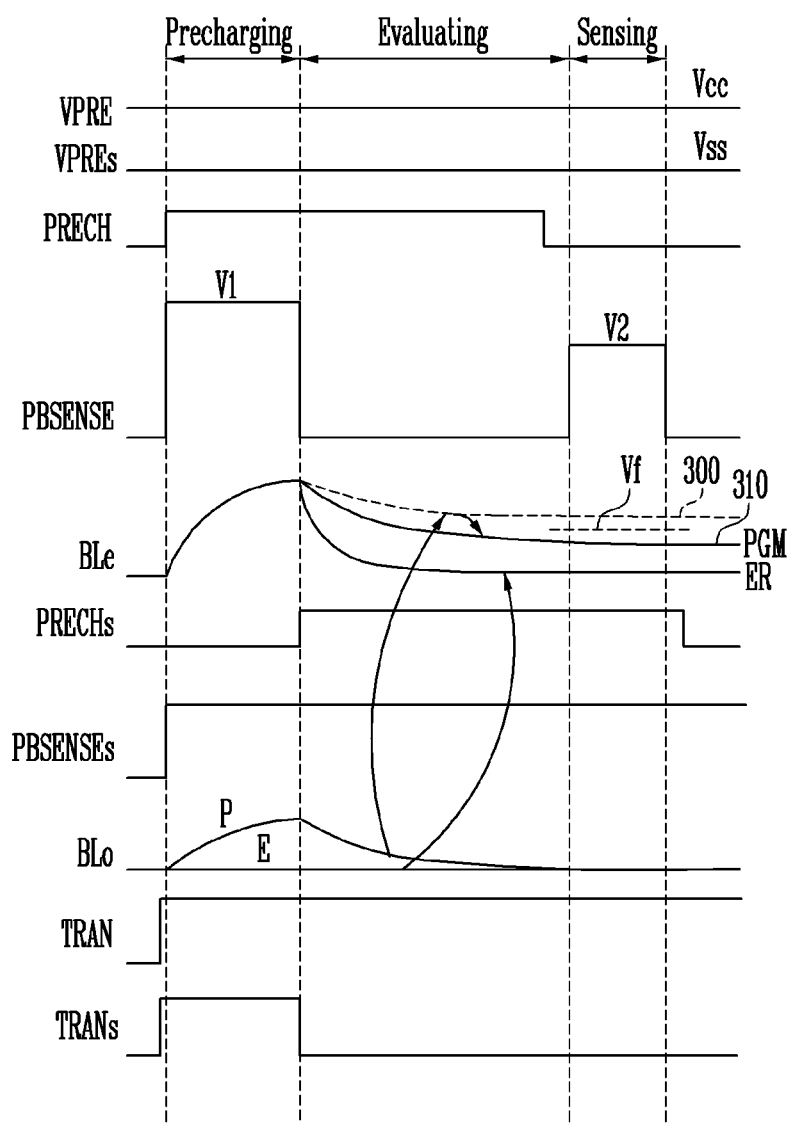
FIG. 4 is a timing diagram illustrating a reading operation according to an embodiment of the present invention.

FIG. 4 shows a timing sequence of a reading operation according to an embodiment of the present invention.

Now referring to FIGS. 3 and 4, a reading operation of the first cell Ce, subsequent to programming of the first cell and then a second cell Co that is coupled to the second bit line BLo adjacent to the first cell Ce, will be described. As stated above, a threshold voltage of the first cell Ce may be changed in a considerable degree, relative to other cells, due to a large amount of electromagnetic interference that is more induced when programming an MSB into the second cell Co than when programming an LSB into the second cell Co. Particularly, as the threshold voltage of the second cell Co varies in a larger degree when programming the second cell Co into the first or third programmed state PV1 or PV3, such electromagnetic interference may affect more the first cell Ce. Relatively, when the second cell Co is shifted into the second programmed state PV2, electromagnetic interference is generated in a relatively small amount because an MSB is programmed into the second cell Co after programming an LSB (i.e, a pre-programming operation) in the second cell Co from the erased state PV0. Thus, the reading operation for the first cell Ce is conducted differently dependent on a programmed state of the second cell Co.

Before reading the first cell Ce, the second cell Co is first read and data "1" or "0" is stored into the second latch LATs of the second page buffer 240 in accordance with data stored in the second cell Co. If the second cell Co is conditioned in the erased state PV0 or the second programmed state PV2 (i.e., if the second cell Co has been erased or programmed with an LSB), the second latch LATs outputs data of a low level. In this case, the first cell Ce is read without changing a voltage level of the first bit line BLe. If the second cell Co is conditioned in the first or third programmed state PV1 or PV3 (i.e., if the second cell Co has been programmed with an MSB), the second latch LATs outputs data of a high level and the first cell Ce is read in the following manner.

The reading operation of a selected cell is divided (FIG. 4) into a precharge period for precharging a selected bit line coupled to the selected cell and bit lines adjacent to the selected bit line, an evaluation period for verifying a voltage variation of the selected bit line, and a sensing period for detecting a voltage level from the evaluated selected bit line. These periods will be detailed as follows for reading the first cell Ce.

In the precharge period, the first page buffer 220 selects the first bit line BLe and the second page buffer 240 selects the second bit line BLo. Thereby, the selected bit lines BLe and BLo are precharged. During this precharge period, a compensation voltage applied to the second bit line BLo functions to compensate for a precharge voltage of the first bit line BLe.

While reading the first cell Ce, the first drive voltage VPRE with the level of a power source voltage Vcc is applied to a drain node of the precharge element 228. A drain node of the precharge element 248 included in the second page buffer 240 is supplied with the second drive voltage VPREs of a ground voltage Vss. The transmission signals TRAN and TRANs are activated to turn the transmission elements 222 and 242 on respectively. Then, the first and second latches LAT and LATs included in the first and second page buffers 220 and 240, respectively, are electrically connected respectively to the first and second sensing nodes S0 and S0s.

The first precharge controller CTR generates the first precharge signal PRECH at the level of the power source voltage Vcc and thereby the precharge element 228 is turned on. During this precharge period, the second precharge controller CTRs generates the second precharge signal PRECHs to hold a precharge element 248 of the second page buffer 240 in a turn-off state. The first bit-line selection element 211 of the first bit-line selector 210 is turned on to electrically connect the first bit-line selector 220 with the first bit line BLe. During this precharge period, in the second bit-line selector 230, the second bit-line selection element 232 is turned on to electrically connect the second page buffer 240 with the second bit line BLo.

In the first page buffer 220, the evaluation signal PBSENSE with a level of V1 is activated to turn the evaluation element 221 on. Thus, the sensing node S0 of the first page buffer 220 is electrically connected to the first bit line BLe. The first bit line BLe is precharged with the power source voltage Vcc supplied from the first drive voltage terminal VPRE, via the turned on precharge element 228 to the first sensing node S0, then via the evaluation element 221 to the first node N1, then via the turned on first bit-line selection element 211 to the first bit line BLe. The precharged state of the first bit line BLe is exemplarily illustrated by the rising curve corresponding to BLe in FIG. 4.

At the same time, in the second page buffer 240, an evaluation signal PBSENSEs is activated to turn an evaluation element 241 on. Then, the second sensing node S0s of the second page buffer 240 is electrically connected to the second bit line BLo. The second bit line BLo is precharged to a level of the compensation voltage. In other words, the second bit line BLe is precharged with the voltage level of the second latch LATs (that stores the data read from the second cell Co), via the turned on transmission element 242 to the second sensing node S0s, then via the evaluation element 241 to a second node N5, then via the turned on second bit-line selection element 232 to the second bit line BLo. The precharged state of the second bit line BLo is exemplarily illustrated in FIG. 4 in a rising curved line P and a lower, relatively linear line E corresponding to the high and low levels of the data read from the second cell Co.

More particularly, in the case that the second cell Co is conditioned in the first or third programmed state PV1 or PV3 (line P of FIG. 4), the second bit line BLo is precharged to a high level according to a high level of the compensation voltage. Otherwise, in the case that the second cell Co is conditioned in the erased state PV0 or the second programmed state PV2 (line E of FIG. 4), the second bit line BLo remains on a low level according to a low level of the compensation voltage.

In the evaluation period, a voltage level of the first bit line BLe is compensated for dependent on a data state of the second cell Co.

Figure 6:
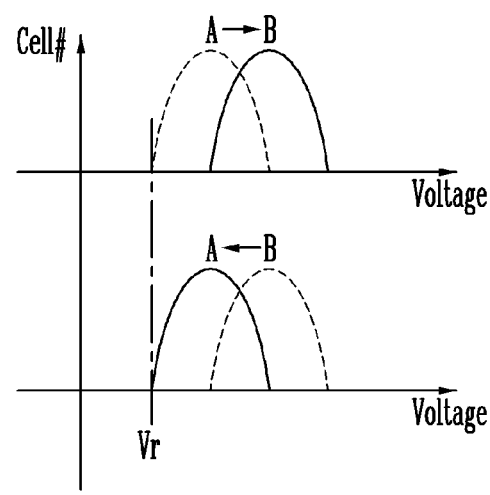
FIG. 6 is a graphic diagram showing variations of threshold voltage distributions according to an embodiment of the present invention.

The procedure of compensating for a voltage level of the first bit line BLe is as follows. A read voltage Vr (FIG. 6) is applied to a word line (e.g., WL1) coupled to a selected cell Ce, while a pass voltage Vpass is applied to the remaining word lines. After turning the drain selection transistor DST on, the source selection transistor SST is turned on. Then, the process begins to evaluate a threshold voltage of the first cell Ce as follows.

If the second cell Co is verified as being in the erased state PV0 or the second programmed state PV2 (E), there is no effect to a voltage level of the first bit line BLe because the second bit line BLo is set on a low level (line E in FIG. 4).

If the second cell Co is conditioned in the first or third programmed state PV1 or PV3 (line P in FIG. 4), the second bit line BLo that has been precharged to a high level is discharged while evaluating the first bit line BLe.

In the evaluation period, the precharge element 248 is turned on while the evaluation element 241 of the second page buffer 240 is being turned on. Thereby, the second bit line BLo is discharged through the second sensing node S0s and a terminal VPREs to which the ground voltage Vss is supplied.

At the same time, in the first page buffer 220, the evaluation signal PBSENSE is deactivated to turn the evaluation element 221 off, thereby isolating the precharged first bit line BLe from the power source voltage Vcc at the first drive voltage terminal VPRE.

As a result, the precharged voltage of the isolated first bit line BLe falls down (e.g., from the level of 300 to the level of 310, as shown in FIG. 4) by discharging over a capacitive coupling between the first and second bit lines BLe and BLo to the terminal VPREs.

Such a capacitive coupling between bit lines enables the threshold voltage of the first cell Ce to decrease from a level 300 above a reference voltage Vf (that is to be designed as an optimum read voltage) to a level 310 below the reference voltage Vf.

During the evaluation period, the precharge element 228 of the first page buffer 220 is turned off.

In the sensing period, a voltage level of the first bit line, which has been compensated for, is sensed to read the first cell Ce.

The first precharge signal PRECH of the first page buffer 220 is deactivated to turn the precharge element 228 off. The first cell Ce can be read by activating the evaluation signal PBSENSE of the first page buffer 220 in a second voltage V2. If the first cell Ce which has been affected by electromagnetic interference is read without voltage compensation (i.e., at the level 300), a read threshold voltage of the first cell Ce would be higher than the reference voltage Vf (FIG. 4) that is to be designed as an optimum read voltage (see the upper pre-compensated graph of FIG. 6). But, the compensation voltage according to one or more embodiments of the present invention contributes to compensate the first cell Ce for its change in threshold voltage (see the post-compensated graph of FIG. 6), thereby enabling the data of the first cell Ce to be read at the level 310 lower than the reference voltage Vf, even when there has been electromagnetic interference.

The above description of the evaluation and sensing periods has been given for the situation where the data read from the second cell Co is at a high state (i.e., the second cell Co is conditioned in the first programmed state PV1 or the third programmed state PV3) that corresponds to line P in the chart of BLo in FIG. 4. The description given below will address the situation where the data read from the second cell Co is at a low state (i.e., the second cell Co is conditioned in the second programmed state PV2 or erased) that corresponds to line E in the chart of BLo in FIG. 4.

Specifically, when the data read from the second cell Co is at a low state, the second bit line BLo remains at a low level from the precharge period into the evaluation period. During the evaluation period, when the precharge element 248 is turned on, the second bit line BLo quickly discharges to the terminal VPREs because its voltage is already at a low level. Consequently, the first bit line BLe also quickly discharges via the capacitive coupling between the first and second bit lines BLe, BLo. The quick discharge of the first bit line Ble brings its voltage at the end of the evaluation period to a level ER which is the same as or at least close to the voltage level of the first bit line BLe before the precharge period. Subsequently, the first cell Ce is read (i.e., the voltage of the first bit line Ble is sensed) in the sensing period as though no pre-charging had happened. This reading operation of the first cell Ce when the second cell Co is at a low data state corresponds to step 420 of FIG. 2.

Figure 5:
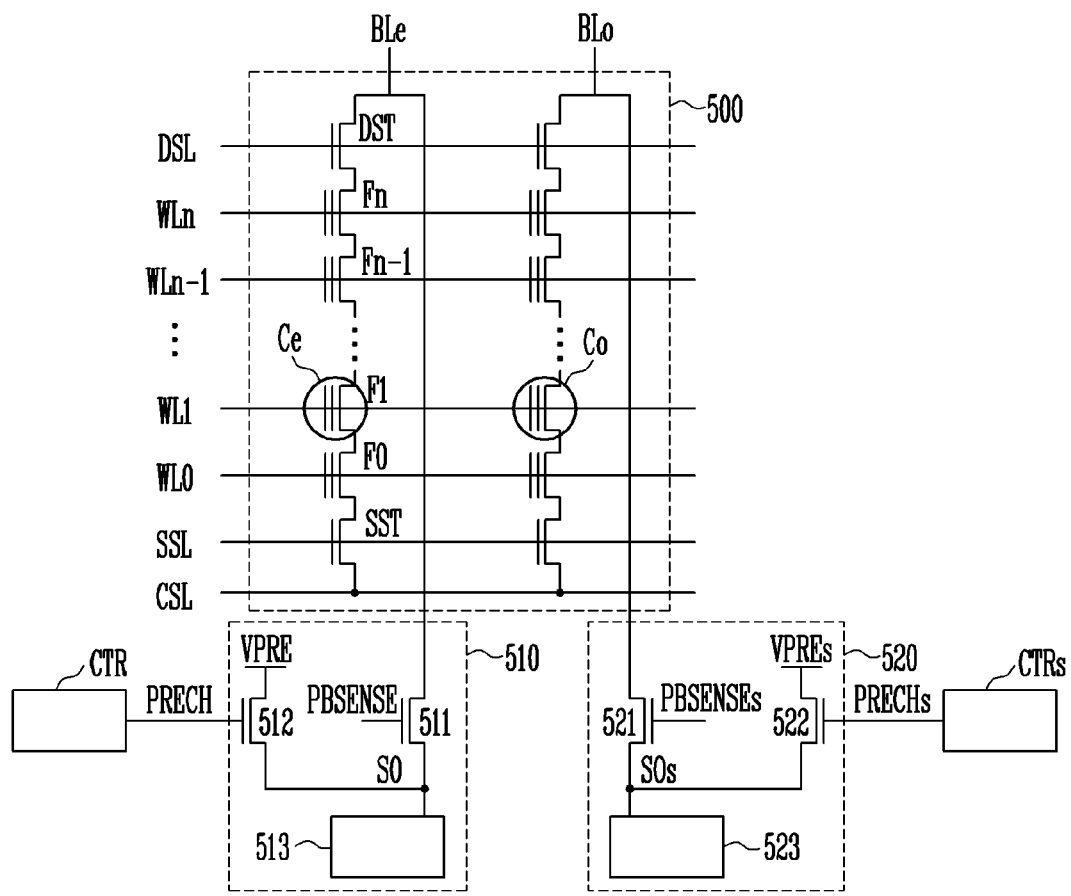
FIG. 5 is a circuit diagram illustrating a nonvolatile memory device according to another embodiment of the present invention.

FIG. 5 illustrates another exemplary configuration of a nonvolatile memory device according to one or more embodiments of the present invention.

Referring to FIG. 5, this nonvolatile memory device is capable of independently driving bit lines by providing page buffers respective to the bit lines without bit-line selectors. In this structure, page buffers are each associated with the respective precharge controller. The structural and operation features of the nonvolatile memory device will be detailed herein below.

The nonvolatile memory device includes a memory cell array 500 to store data, and page buffers 510 and 520 to transfer voltages to the memory cell array 500 through bit lines. These page buffers in some embodiments are provided in the same number as the bit lines. For convenience of description, only two page buffers and there respective bit lines are illustrated in FIG. 5. The first page buffer 510 is connected to the memory cell array 500 by way of the first bit line BLe and the second page buffer 520 is connected to the memory cell array 500 by way of the second bit line BLo. In particular, the page buffers 510 and 520 are coupled to the respective precharge controllers CTR and CTRs for generating the precharge signals PRECH and PRECHs, respectively. That is, the first page buffer 510 is coupled to the first precharge controller CTR and the second page buffer 520 is coupled to the second precharge controller CTRs.

The memory cell array 500 is composed of a plurality of first and second strings (or even and odd strings). Each string includes a plurality of memory cells F0~Fn (n is a natural number) which are coupled in series. A source node of the string is coupled to a source selection transistor SST and a drain node of the string is coupled to a drain selection transistor DST. The source selection transistor SST is coupled between the first cell F0 and a common source line CSL.

Gate nodes of the memory cells (e.g., a plurality of F0) belonging to their respective strings are coupled with one word line (e.g., WL0) in common. Thus, the gate nodes of the memory cells F0~Fn of the strings are respectively coupled to word lines WL0~WLn on rows. Gate nodes of the source selection transistors SST belonging to their respective strings are coupled to a source selection line SSL in common. Gates nodes of the drain selection transistor DST belonging to their respective strings are coupled to a drain selection line DSL in common.

The first and second page buffers 520 and 540 are formed in the same structure. Thus, hereinafter, only the first page buffer 510 will be described in detail.

The page buffer 520 is comprised of an evaluation element 511, a first latch LAT and a precharge element 512. The evaluation element 511 is coupled between the first bit line BLe and a first sensing node S0, and operates in response to an evaluation signal PBSENSE. The first latch LAT is coupled to the first sensing node S0. The precharge element 512 is coupled between a terminal of a drive voltage VPRE and the first sensing node S0.

In a reading operation for the first cell Ce, the first precharge controller CRT deactivates the precharge signal PRECH after precharging the first bit line BLe, but the second precharge controller CTRs makes the precharge signal PRECHs being active during the evaluation and sensing periods. This is for discharging the second bit line BLo while evaluating and sensing the first bit line BLe.

Reading a selected cell, e.g., the first cell Ce, is conducted in the same procedure described above with reference to FIGS. 3 and 4. In this reading operation, the second bit line BLo is precharged according to data stored in the second cell Co while precharging the first bit line BLe. A voltage level of the first bit line BLe is evaluated while discharging the second bit line BLo. Thus, a voltage level of the first bit line BLe can be lowered by a capacitive coupling between the first and second bit lines Ble, Blo as well as by the discharging of the second bit line BLo. Then, the first bit line BLe that has been compensated for in voltage level is sensed to complete the reading operation of the first cell Ce.

Although the specifically disclosed embodiments are described with two adjacent cells between two adjacent strings in the memory cell array, further embodiments that consider more than two adjacent cells are within the scope of this disclosure. As an example, there are multiple first and second bit lines BLe and BLo in the memory cell array 500 and multiple second cells Co can be disposed at both sides of the selected first cell Ce. From this disposition, data states stored in the second cells Co can be different from each other to cause a threshold voltage of the first cell Ce to be variously affected. In this case, after reading two pieces of data respectively from the second cells coupled to the adjacent strings at both sides of the string of the first cell Ce, the two pieces of read data are each stored into the page buffers associated with to the second bit lines BLo. After precharging the second bit lines BLo in accordance with data stored in the page buffers, the second bit lines BLe are discharged while evaluating the first bit line BLe. Therefore, the first cell Ce can be read with compensation for any existing electromagnetic interference from the adjacent second cells Co (see the lower curve of FIG. 6).

As described above, the reliability of a reading operation is improved by properly discharging a bit line adjacent to a selected bit line even when there is a variation of threshold voltages between adjacent cells due to electromagnetic interference that is induced in a previous programming operation.

While the foregoing description of the specific embodiments has been given for multi-level cells (MLC) each capable of storing more than one bit of information by having three programmed states (PV1-PV3), the disclosure is not limited to such specifically disclosed memory cells, and include embodiments directed to single-level cells (SLC) each capable of storing one bit of information, or to MLCs that have other than three programmed states.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A nonvolatile memory device, comprising:
circuitry for performing a read operation of a selected first memory cell associated with a selected first bit line, said circuitry being configured for precharging a second bit line, which is adjacent to the selected first bit line, in response to a threshold voltage of a second memory cell associated with the second bit line, and
discharging the precharged second bit line when the read operation of the selected first memory cell associated with the selected first bit line is performed.

2. The nonvolatile memory device according to claim 1, wherein the circuitry comprises:
first and second page buffers coupled to the first and second bit lines, respectively, to sense voltage levels on the first and second bit lines and to control precharge levels of the first and second bit lines in response to first and second precharge signals, respectively; and
first and second precharge controllers coupled to the first and second page buffers, respectively, to output the first and second precharge signals in accordance with the sensed voltage levels of the first and second bit lines.

3. The nonvolatile memory device according to claim 2, wherein each of the first and second page buffers includes a bit line selector for selectively connecting the first or second page buffer to the first or second bit lines.

4. The nonvolatile memory device according to claim 2, wherein the first page buffer comprises:
a first evaluation element operatively coupled between the first bit line and a first sensing node, and responsive to a first evaluation signal in a reading operation of the first memory cell;
a first precharge element coupled to the first sensing node for precharging the first bit line via the first evaluation element in response to the first precharge signal; and
a first latch coupled to the first sensing node to sense a voltage level on the first bit line.

5. The nonvolatile memory device according to claim 2, wherein the second page buffer comprises:
a second evaluation element operatively coupled between the first bit line and the a second sensing node, and responsive to a second evaluation signal in the reading operation of the first memory cell;

a second latch coupled to second sensing node for precharging the second bit line via the second evaluation element in accordance with the threshold voltage of the second memory cell; and a second precharge element coupled to the second sensing node to discharge the second bit line in response to the second precharge signal.

6. The nonvolatile memory device according to claim 4, wherein the first precharge controller is coupled with a gate node of the first precharge element and configured to generate the first precharge signal to precharge the first bit line.

7. The nonvolatile memory device according to claim 5, wherein the second precharge controller is coupled with a gate node of the second precharge element and configured to generate the second precharge signal to precharge the second bit line.

8. A nonvolatile memory device comprising:
a memory cell array including a first memory cell coupled to a first bit line and a second memory cell coupled to a second bit line;
a first page buffer coupled to the first bit line;
a first precharge controller coupled to the first page buffer and configured to generate a first precharge signal to the first page buffer to precharge the first bit line;
a second page buffer coupled to the second bit line; and
a second precharge controller coupled to the second page buffer and configured to generate a second precharge signal to the second page buffer to precharge or discharge the second bit line in response to a threshold voltage of the second memory cell while reading the first memory cell.

9. The nonvolatile memory device according to claim 8, wherein the first page buffer comprises:
a first evaluation element coupled between the first bit line and a first sensing node, and responsive to a first sensing signal;
a first precharge element coupled between the first sensing node and a node to which a first drive voltage is applied, and responsive to the first precharge signal generated from the first precharge controller; and
a first latch coupled with the first sensing node.

10. The nonvolatile memory device according to claim 9, wherein the second page buffer comprises:
a second evaluation element coupled between the second bit line and a second sensing node, and responsive to a second sensing signal;
a second precharge element coupled between the second sensing node and a node to which a second drive voltage is applied, and responsive to the second precharge signal generated from the second precharge controller; and
a second latch coupled with the second sensing node.

11. The nonvolatile memory device according to claim 8, wherein, while reading the first memory cell, the first precharge controller is configured to deactivate the first precharge signal after evaluating the first bit line, and the second precharge controller is configured to substantially maintain the second precharge signal on an active state while evaluating and sensing the first bit line.

12. A method of reading a nonvolatile memory device, the method comprising:
programming a memory block including a first memory string coupled with a first bit line and a second memory string coupled with a second bit line adjacent to the first bit line;
reading a second memory cell of the second memory string;
precharging the second bit line in accordance with a threshold voltage of the second memory cell; and
reading a first memory cell of the first memory string while discharging the precharged second bit line.

13. The method according to claim 12, wherein the second memory cell is programmed after programming the first memory cell and before reading the second memory cell.

14. The method according to claim 12, further comprising:
storing data of a high or low level into a second page buffer coupled to the second bit line in accordance with the threshold voltage of the read second memory cell after reading the second memory cell; and
precharging the second bit line to a high or low level in accordance with the data stored in the second page buffer.

15. The method according to claim 14, wherein
the high level data is stored into the second page buffer if the threshold voltage of the second memory cell varies in a relatively large range while programming the second memory cell, and
the low level data is stored into the second page buffer if the threshold voltage of the second memory cell varies in a relatively small range while programming the second memory cell.

16. The method according to claim 14, wherein the threshold voltage of the second memory cell is distributed in one of an erased state, a first programmed state that is higher than the erased state in voltage level, a second programmed state that is higher than the first programmed state in voltage level, and a third programmed state that is higher than the second programmed state in voltage level.

17. The method according to claim 16, wherein
the second bit line is precharged to the high level if the second memory cell is conditioned in the first or third programmed state, and
the second bit line is precharged to the low level if the second memory cell is conditioned in the erased state or the second programmed state.

18. The method according to claim 12, further comprising:
discharging the second bit line to compensate for a voltage level of the first bit line while evaluating a voltage from the first bit line; and
sensing a voltage variation from the first bit line.

19. The method according to claim 12, further comprising:
precharging the first bit line to a predetermined voltage; and
discharging the precharged first bit line over a capacitive coupling between the first and second bit lines.

* * * * *